United States Patent
Chen et al.

(10) Patent No.: US 8,860,059 B2
(45) Date of Patent: Oct. 14, 2014

(54) LIGHT EMITTING DEVICES, SYSTEMS, AND METHODS OF MANUFACTURING

(71) Applicants: Wenxin Chen, Xiamen (CN); Zhibai Zhong, Xiamen (CN); Charles Siu Huen Leung, Xiamen (CN)

(72) Inventors: Wenxin Chen, Xiamen (CN); Zhibai Zhong, Xiamen (CN); Charles Siu Huen Leung, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 40 days.

(21) Appl. No.: 13/624,937

(22) Filed: Sep. 23, 2012

(65) Prior Publication Data
US 2013/0026525 A1   Jan. 31, 2013

Related U.S. Application Data

(63) Continuation of application No. PCT/CN2012/075070, filed on May 4, 2011, and a continuation of application No. PCT/CN2012/075071, filed on May 4, 2011.

(51) Int. Cl.
| | |
|---|---|
| *H01L 33/60* | (2010.01) |
| *H01L 33/62* | (2010.01) |
| *H01L 33/64* | (2010.01) |
| *H01L 33/00* | (2010.01) |
| *H01L 33/20* | (2010.01) |
| *H01L 33/40* | (2010.01) |

(52) U.S. Cl.
CPC ......... *H01L 33/62* (2013.01); *H01L 2924/0002* (2013.01); *H01L 33/642* (2013.01); *H01L 33/0079* (2013.01); *H01L 33/20* (2013.01); *H01L 33/405* (2013.01); *H01L 33/647* (2013.01)
USPC .............................................. 257/98; 438/29

(58) Field of Classification Search
CPC ..... H01L 33/62; H01L 33/0079; H01L 33/20; H01L 33/405; H01L 33/642; H01L 33/647
USPC ............................. 257/98, E33.072; 438/29
See application file for complete search history.

(56) References Cited

U.S. PATENT DOCUMENTS

| 8,436,386 B2 * | 5/2013 | Gandhi et al. ................... 257/98 |
| 2010/0140635 A1 * | 6/2010 | Ibbetson et al. ................. 257/98 |

FOREIGN PATENT DOCUMENTS

| CN | 101521252 A | 9/2009 |
| CN | 101673794 A | 3/2010 |
| JP | 5-167101 A | 7/1993 |
| TW | 495999 B | 7/2002 |

OTHER PUBLICATIONS

First Office Action in Application No. CN201110165297.3; mailed Apr. 12, 2012.
First Office Action in Application No. CN 201110165321.3; mailed Apr. 12, 2012.

\* cited by examiner

*Primary Examiner* — Walter H Swanson
(74) *Attorney, Agent, or Firm* — Syncoda LLC; Feng Ma

(57) ABSTRACT

A light emitting device includes: a substrate; an n layer; an active light emitting region, a p layer; and a support portion configured to provide both mechanical support and improve light transmission disposed over a light emitting side of the device.

18 Claims, 11 Drawing Sheets ns of 15 microns.
LIGHT EMITTING DEVICES, SYSTEMS, AND METHODS OF MANUFACTURING

CROSS-REFERENCE TO RELATED APPLICATIONS

The present application is a continuation of, and claims priority to, PCT/CN2012/075070 and PCT/CN2012/075071, both filed May 4, 2012, which claim priorities respectively to Chinese Patent Application Nos. CN 201110165297.3 and CN 201110165321.3, both filed Jun. 20, 2011. The disclosures of the above applications are hereby incorporated by reference in their entirety.

BACKGROUND

A light emitting diode (LED) can provide light in a more efficient manner than conventional light sources such as incandescent light and/or gas-discharge light sources. LEDs can emit light in various wavelengths, such as in red, green, blue, or ultraviolet (UV) ranges. UV light covers wavelengths ranging from about 190 to about 420 nanometers. Typically, UVA covers the range of about 400-315 nm, UVB covers the range of about 315-280 nm, and UVC, which may be germicidal, covers the range of about 280-100 nm.

SUMMARY

In an aspect, a light emitting device is provided including: a substrate; an n layer; an active light emitting region, a p layer; and a support portion configured to provide both mechanical support and improve light transmission disposed over a light emitting side of the device.

In some implementations, the light emitting device further includes: a submount over a side of the active light emitting region opposite a side of the substrate, wherein the submount includes a plurality of conductive vias; a contact layer; a conductive layer; and a reflective contact layer opposite to the light emitting side; wherein the support portion is formed by thinning the substrate.

In some implementations, an area of the plurality of vias has a fraction of less than 60% of a total surface area of the submount.

In some implementations, the light emitting device further includes a bonding layer over a surface of the submount.

In some implementations, the bonding layer includes a conductive material having an electrical resistivity in the range of $1.0 \times 10^{-8}$ to $1.0 \times 10^{-4}$ $\Omega \cdot m$.

In some implementations, the bonding layer has a melting point above 200° C.

In some implementations, the conductive layer includes a conductive material having an electrical resistivity in the range of $1.0 \times 10^{-8}$ to $1.0 \times 10^{-4}$ $\Omega \cdot m$.

In some implementations, the light emitting device further includes an adhesive metal comprising one or more layer of Cr, Ti and Ni.

In some implementations, the light emitting device further includes a reflector metal contact comprising one or more of layers of Al, Ag, Pt, or Au.

In some implementations, the light emitting device further includes a contacting metal layer comprising a combination of one or more layers of Cr, Ti, Pt, Au, Al, Ni, Pd, or Ge.

In some implementations, the support portion includes at least one through via (such as an array of through vias) configured to electrically couple the device to an external power source.

In some implementations, an area of the array of through vias is a fraction of less than 40% of a total surface area so as to maintain a substantial mechanical strength of the device.

In some implementations, the support portion has a thickness of not less than 15 microns.

In some implementations, the support portion has an array of blind vias forming an optical functional surface to improve light output.

In some implementations, the blind vias have a depth less than half the thickness of the through via so as to maintain a substantial mechanical strength of the support portion.

In some implementations, the array of blind vias have a surface area less than 60% of a total surface area of the support portion.

In some implementations, the light emitting device further includes: a reflector opposite the light emitting side; and a plurality of microchannels configured to optically couple the active light emitting region and the reflector.

In another aspect, a method of manufacturing a light emitting device is provided, wherein the device comprises: a substrate; an n layer; an active light emitting region, a p layer; and a support portion configured to provide both mechanical support and improve light transmission disposed over a light emitting side of the device; wherein the method comprises: thinning the substrate to form the support portion.

In some implementations, the device further includes a reflector, the method further including: forming a plurality of microchannels in a UV-absorbing layer (such as the n layer or the p layer) to improve optical coupling between the n layer or the p layer to the reflector.

In some implementations, the method further includes: bonding the substrate, the n layer, the active light emitting region, and the p layer with a submount having conducting through vias; and forming a plurality of blind and through vias in the thinned substrates.

DETAILED DESCRIPTION

Figure 1:
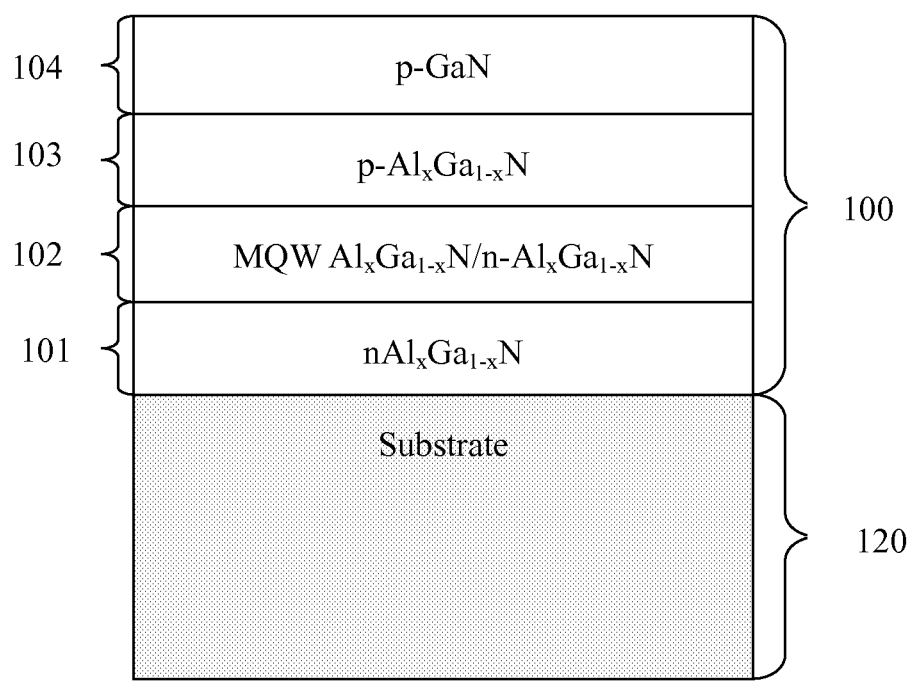
FIG. 1 is a schematic view of a prior art device structure.

Some of the described embodiments are drawn to light emitting structures, devices and/or systems, and methods of manufacturing the devices. In some embodiments, light emitting structures may be formed with reduced layer thicknesses, and an opto-mechanical support portion can be formed adjacent the light emitting surface. The opto-mechanical support portion may help preserve the integrity of the light emitting active region located between the growth substrate and the submount during processing, and may also provide a desired optical pattern configured to enhance light emitting from the light emitting active region. In some embodiments, substrate thinning or reduction methods are provided to form the opto-mechanical support portion, and the resulting structures can enhance light output while maintaining the mechanical stability of the interleaving thin structure. In some implementations, UV light emitting structures with the thin opto-mechanical support structures help reduce light absorption in materials used to manufacturing the light emitting structures, as some of the materials may be self-absorbing.

UV LEDs can be manufactured to emit light in the ultraviolet range, although in practice LED arrays may have very limited efficiency at wavelengths below 365 nm. In an example, LED efficiency at 365 nm may be only about 5-8%, but at 395 nm it can exceed 20%. At the longer UV wavelengths the LEDs may also have improved power outputs. Such LED arrays can be used for UV curing applications, for example, such as in digital print applications and inert UV curing environments. Current UV LEDs can have output power densities approaching 3,000 mW/cm$^2$ (30 kW/m$^2$). The high power output together with recent advances in the development of photo-initiators and resin formulations may allow using specific UV-LED wavelengths in the UV curing industry for cost-effective curing applications. Meanwhile, unlike other UV LED having wavelengths above 300 nm, UVC may have direct germicidal UV rays, which can be effectively used in disinfection and sterilization, water purification, and medical treatment without using secondary photo-catalyst such as TiO2 to generate ozone for sterilization. Therefore, further technological development in increasing the luminous flux of ultraviolet light-emitting diodes has a significant impact on the future application fields of ultraviolet light-emitting diodes, and various systems comprising these LEDs can be provided according to embodiments disclosed herein.

An LED may comprise multiple layers, with at least some of the layers formed from different materials. The materials and thicknesses selection can affect the wavelength of light emitted by the LED. The compositions of the layers can also be selected to promote isolation or injection of electrical charge carriers into regions (e.g., quantum wells regions) for efficient conversion into optical power. The layer on one side of the junction where quantum wells are grown may be doped with donors, resulting in higher electron concentration (e.g., the n-layer), while the layer on the opposite side may be doped with acceptors, resulting in higher hole concentration (e.g., the p-layer).

LEDs may also include electrical contact structures (e.g., electrodes) for connecting to an external electrical power source. The power source can provide electrical current to the device via the contact structure along the length of the structure over a surface of the device where electrical energy can be converted into light. Metals may be used as contact structures on the surface of an LED. However, these contact structures can block light emitted from the light emitting structures.

According to some implementations, a method of making the light emitting device may include providing a first multi-layer stack. The first multi-layer stack may include a substrate, a submount having vias therein, a p-layer, a light emitting region, and a n-layer. The p-layer, the lighting emitting region (e.g., for emitting light with wavelengths below 315 nanometer), and the n-layer may be sandwiched between the substrate and the submount. In the description, substrate and submount may each comprise a base material for building layers to accomplish the functionalities of the device and may be used interchangeably. The submount can have a high thermal conductivity as a result of having the vias filled with excellent heat dissipating metal such as cooper. The method may further include forming micro channels in the p-layer to enhance the transmission of back reflected light to the metal reflector, thereby increasing the light emitting output in the forward direction. The method may further include the bonding of the submount onto the metal contact structure of the p-layer, and depositing an optimal light reflector onto the p-layer. The vias may be filled with a conductive material to provide connection of the p-layer to the external power source.

In some implementations, the method may further include reducing the thickness of the substrate to multiple quarter-wave integer optical thicknesses forming the opto-mechanical support structure. Through vias filled with a conductive material in the opto-mechanical support structure may provide connections from the n-layer to the external power source. "Blind" vias may also be employed forming a desired optical pattern to extract light from the light emitting active region by reducing self-absorption in the material. Such an opto-mechanical portion may act as a mechanical support to stabilize the multi-layer light emitting structures of the multi-layer stack while providing improved optical properties.

According to some embodiments, a transfer of a light generating layer (e.g. an active region of a light emitting diode or laser) onto a desired submount with vias may be realized. In some embodiments, multiple arrays of micro-channels may be formed in the p-layer in proportion to the surface area, to increase light transmittance without affecting the electrical characteristics for light emitting generating mechanism.

The micro-channels in the p-layer may be formed by dry etching such as inductively coupled plasma (ICP) etching, and/or wet chemical techniques. The p-layer may be first coated with a protective layer, followed by a photo-resist coating. The desired pattern may be form by exposing the photo-resist with a mask, and subsequently removing the material to attain the controlled depths by etching. After removing the photo-resist mask and the protective coating, a metal contact can be deposited onto the p-layer with extremely thin adhesive metal layer followed by a reflective metal. The reflective metal may include shiny metal such as Al, Pt, Ag etc. Inert metals may be deposited to complete the metal scheme for an effective ohmic contact.

The submount with the desired via pattern may be formed by various approaches according to the described implementations, such as laser or mechanical drilling, and the conducting vias are formed by electroplating gold, copper, nickel etc. The submount can then be bonded to the metal layer on the p-layer using a bonding metal. The bonding metal may include an eutectic metal such as AuSn, AgSn etc., which has a low melting temperature to help attain a relatively void free interface between the submount and the p-metal layer.

In some embodiments, the substrate material may be thinned using chemical and/or mechanical methods to a desired thickness for sufficient mechanical strength for the multi-layer stack. After the desired thickness has been achieved, through vias and blind vias can be formed using dry and/or chemical etching. Formation of these via may be effected by laser machining and by two-level masking with dry and/or wet chemical etching. For example, the substrate can be thinned by precision mechanical grinding and polishing followed by coating with a protective layer such as PECVD SiO2. A photo-resist layer can then be deposited, and subsequently exposed to form the through via pattern. After removing the photo-resist, the metal contact scheme can be deposited onto the n-layer through the vias. A second-level mask can then be used to define the pattern of the blind vias having a depth, which may be half the depth of the through vias. Such a layer with the desirable thickness and optical pattern can form an opto-mechanical support structure adjacent the light emitting surface, to stabilize the light emitting region sandwiched between the substrate and submount.

In some implementations, a deep UV semiconductor light-emitting device and manufacturing method thereof are provided.

The deep UV semiconductor light-emitting device may include: a substrate with conductive channels; a light-emitting epitaxial structure including an n-type semiconductor layer, a light-emitting layer, and a p-type semiconductor layer; an opto-mechanical support structure with conductive channels; the light-emitting epitaxial structure being sandwiched between the substrate and the opto-mechanical support structure, one side of the opto-mechanical support structure being the light-emitting surface.

In some implementations, the semiconductor layer adjacent the substrate side includes microchannels for light transmission.

In some implementations, the opto-mechanical support structure may include single-crystal materials, which on one hand may serve as the template for epitaxial growth, and on the other hand as the effective light modulator to extract light from the light emitting region.

In some implementations, the thickness of the opto-mechanical support structure may be ¼ integer multiple of the emission wavelength.

In some implementations, the thickness of the opto-mechanical support structure may be 5~100 μm.

In some implementations, the surface of the opto-mechanical support structure has a series of microchannels, the depth of which may be less than the thickness of the opto-mechanical support structure.

In some implementations, the depth of the microchannels may be less than ½ the thickness of the opto-mechanical support structure, so as to withstand the corresponding physical stress.

In some implementations, the total area of the substrate conducting channels may be less than 60% of the total surface area of the substrate, to ensure good contact and physical stability.

In some implementations, the substrate and/or submount may be connected by a metal structure with the light-emitting epitaxial structure.

In some implementations, the metal structure may include: a reflective layer, an ohmic metal contact layer, and a bonding layer.

In some implementations, the bonding layer may be made of a conductive material, with a resistivity from $1.0 \times 10^{-8}$ to $1.0 \times 10^{-4}$ Ω·m.

In some implementations, the substrate or submount material may be selected from ceramics or silicon, and has a good heat dissipation ability.

In another aspect, a method of making a deep UV semiconductor device is provided. The method may include:

1) Epitaxially growing a light-emitting epitaxial structure over a single-crystal substrate, the light-emitting epitaxial structure including a n-type semiconductor layer, a light-emitting layer, and a p-type semiconductor layer;

2) Providing a substrate with conductive channels, and connecting it with the light-emitting epitaxial structure; the light-emitting epitaxial structure being sandwich between this substrate and the aforementioned single-crystal substrate;

3) Thinning the single-crystal substrate, forming conductive channels on the single-crystal substrate, the conductive channels coupled to an external power supply and the light-emitting epitaxial structure, and forming an opto-mechanical support structure.

In some implementations, the method may also include: forming microchannels for light transmission on the entire outer cover layer of the epitaxial structure.

In some implementations, in step 2) above, the submount may be jointed with the light-emitting epitaxial structure through the metal bonding layer. Some specific steps may include: forming a reflective layer on the surface of the light-emitting epitaxial structure; forming an ohmic contact layer on the reflective layer; forming a eutectic metal layer on the ohmic contact layer; and bonding the submount with the eutectic metal layer.

In some implementations, the substrate is thinned such that the thickness of the opto-mechanical support structure may be ¼ integer multiple of the emission wavelength.

In some implementations, the thickness of the opto-mechanical support structure of may be about 5~100 μm. Such a thickness may help stabilizing the multi-layer film light-emitting structure while increasing the light emission efficiency.

In some implementations, the step 3) above may also include: forming microchannel patterns in the opto-mechanical support structure, the depth of the patterns being less than the thickness of the opto-mechanical support structure.

In some implementations, the method includes forming microchannels with a depth of less than ½ the thickness of the opto-mechanical support structure, so as to withstand the corresponding physical stress.

In some implementations, the method includes forming the microchannels with a total area of less than or equal to 60% of the total surface area of the light emitting surface, to ensure physical stability.

According to some implementations disclosed herein, a light-emitting epitaxial structure may be sandwiched between an opto-mechanical support structure and a cooling substrate with conductive channels. On one hand, it effectively solves the cooling problems, and on the other hand, it ensures the physical stability and structural integrity of the light-emitting epitaxial structure. It can also serve as a light extraction surface, enhancing light-emitting efficiency.

The cover layer of the light-emitting epitaxial structure may have microchannels for light transmission, disposed over a side away from the light-emitting side of the light-emitting epitaxial structure. This together with the reflective layer allows most of the light to be emitted from one side of the opto-mechanical support structure, preventing the overlay p-GaN from absorbing UV rays and effectively increasing the light-emitting efficiency.

The opto-mechanical support structure may be configured to have a thickness within a specified range. This can stabilize the multi-layer thin-film light-emitting structure, while increasing the light transmission efficiency. Optical patterns formed over the surface of the opto-mechanical support structure can further promote effective light extraction rate.

Some of the disclosed embodiments provide a deep-UV semiconductor light-emitting device.

In some implementations, a deep UV semiconductor light-emitting device may include: a cooling substrate with conductive channels; a light-emitting epitaxial structure, comprising an n-type semiconductor layer, a light-emitting layer, and a p-type semiconductor layer. The epitaxial structure may have two main surfaces, one being a light-emitting surface, the other a non-light-emitting surface; a semiconductor cover layer with microchannels, formed over the non-light-emitting surface side of the light-emitting epitaxial structure; a reflective layer formed over the semiconductor cover layer. The substrate and the reflective layer may be coupled.

In some implementations, the light produced from the light-emitting layer can have a wavelength of about 100 nm~315 nm.

In some implementations, the area of the microchannels over the cover layer may be less than 80% the surface area of the cover layer.

In some implementations, a metal structure may be disposed between the substrate and the reflective layer In some implementations, the metal structure includes an Ohmic metal contact layer and a bonding layer.

In some implementations, the bonding layer is made of conductive material, the resistivity of the material being $1.0 \times 10^{-8} \sim 1.0 \times 10^{-4}$ $\Omega \cdot m$.

In some implementations, the material of the reflective layer is selected from of Al, Ag, Pt, or Au.

In some implementations, the bonding layer has a thickness of 50~10,000 nm.

FIG. 1 illustrates a UV LED prior art device structure 100 including a substrate 120, an n layer 101, a light emitting region 102, a p layer 103, and a capped layer 104 for low-resistance contact. Substrate 120 can include a high-band-gap substrate such as sapphire or aluminum nitride (AlN). In this example device structure, the materials can absorb UV emissions from the light emitting region 102 to some extent, and light emissions particularly in the 100-280 nm range may be significantly reduced due to self-absorption.

Figure 2:
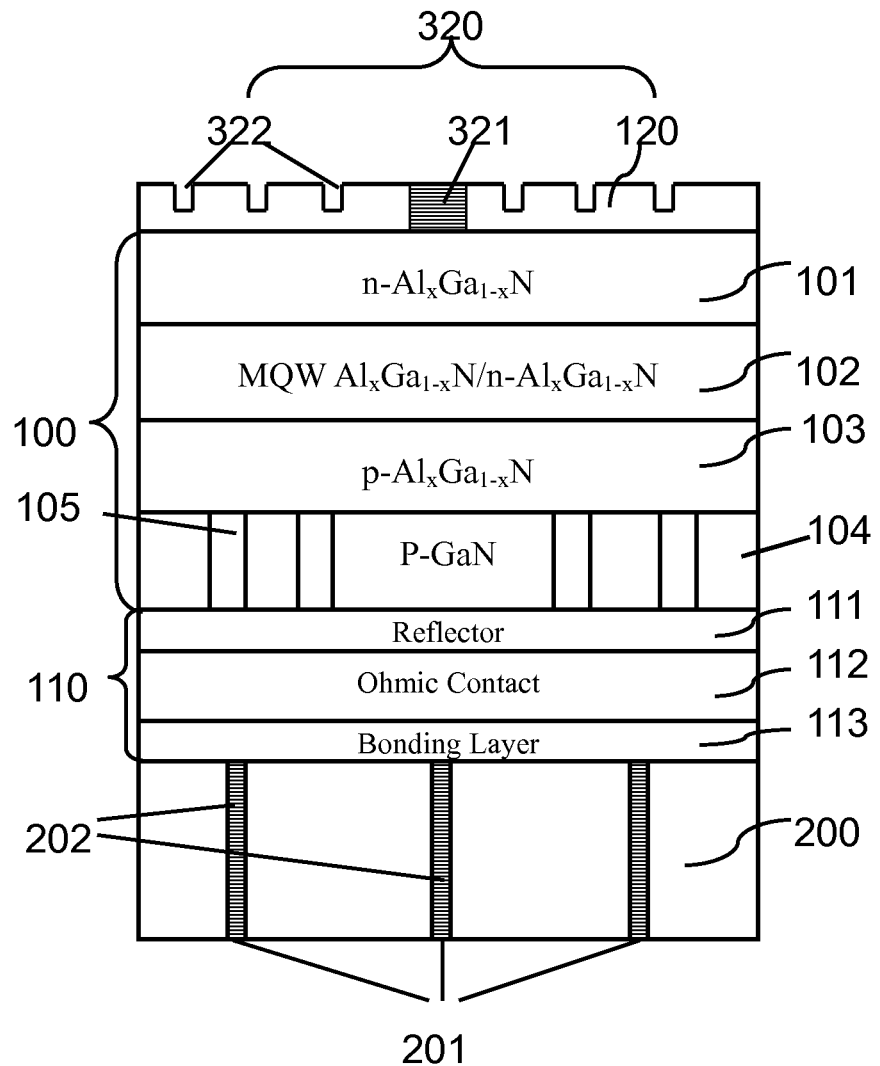
FIG. 2 is a schematic view of a semiconductor light-emitting device according to some implementations.

Shown in FIG. 2 is an example structure of a deep-UV semiconductor light-emitting device, including: a heat-dissipating submount 200, a metal structure 110, a light-emitting epitaxial structure 100, and an opto-mechanical support structure 320.

The heat-dissipating submount 200 may be used to support the light-emitting epitaxial structure. It may comprise materials with good thermal conductivity, for example, ceramic or silicon, and may have a series of through-holes 201. Considering the physical stress tolerance of the substrate, total area of the through holes in some implementations is preferably less than 60% the total area of the submount. In an example, it is about 40%. Filling the through-holes with conductive material can form conductive channels 202, which may be used to conduct the current to the light-emitting epitaxial structure, so as to cause the light-emitting layer to emit light.

The metal structure 110 comprises a metal reflective layer 111, an ohmic metal contact layer 112, and a bonding layer 113. Bonding layer 113 may comprise a conductive material with a resistivity of about $1.0 \times 10^{-8}$ to $1.0 \times 10^{-4}$ $\Omega \cdot m$, and a melting point of above 200° C. Contact layer 112 may comprise a conductive material with a resistivity of about $1.0 \times 10^{-8}$ to $1.0 \times 10^{-4}$ $\Omega \cdot m$. The conductive material may be selected from Au, Ag, Cu, Al, or Pt. The material of the reflective layer 111 may be selected from Al, Ag, Pt, or Au.

The right-emitting epitaxial structure 100 may include an n-type semiconductor contact layer 101 (such as n-$Al_xGa_{1-x}N$), a light-emitting layer 102 (such as $Al_xGa_{1-x}N$/n-$Al_xGa_{1-x}N$ multi quantum well or single quantum well structure), a p-semiconductor contact layer 103 (such as p-$Al_xGa_{1-x}N$), a p-type semiconductor cover layer 104 (p-GaN). Among them, the p-type semiconductor cover layer 104 may have a series of microchannels 105 for light transmission. The surface area of the microchannels 105 according to some implementations does not exceed 80% the total area. The microchannels 105 may be formed in the P-type layer surface to increase the amount of light transmitted to reach the surface of the reflective layer, which reflects the light so as to further enhance the light emission efficiency.

Figure 3:
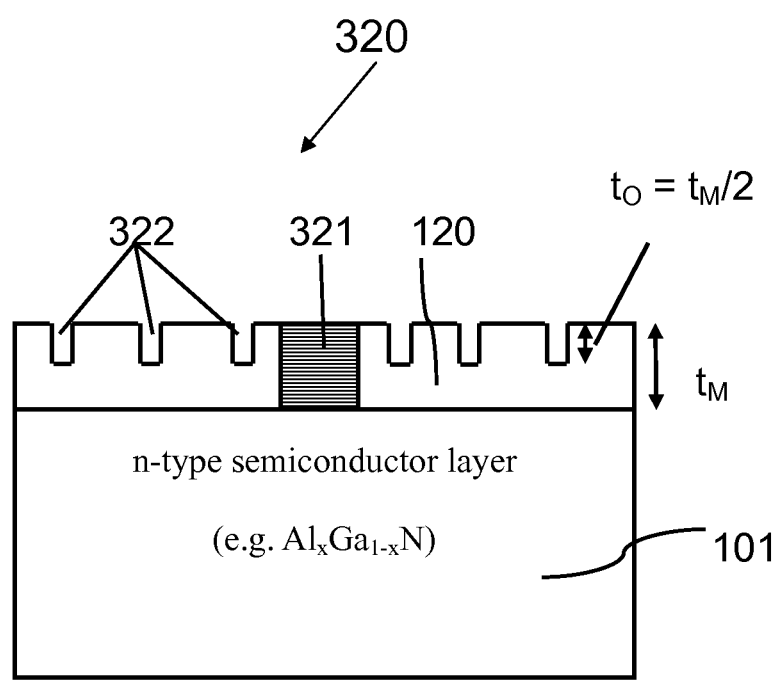
FIG. 3 is a schematic view of an example showing the opto-mechanical support structure according to some implementations.

FIG. 3 illustrates an example opto-mechanical support structure 320. The opto-mechanical support structure 320 may be coupled to the n-type semiconductor layer 101. The opto-mechanical support structure 320 may be formed by thinning the single-crystal substrate 120, which can comprise a material selected from sapphire, AlN, etc. Using $t_M$ to represent the thickness of the opto-mechanical support structure 320, based on light refraction principles, in order to obtain the highest light extraction rate, in the illustrated example the value of $t_M$ may be configured to be equal to integer multiples of ¼ of the emission wavelength. The value of $t_M$, which may control the final thickness, may have a range between 5~100 μm. The opto-mechanical support structure 320 may include conductive channels 321, which may be electrically coupled to n-type semiconductor layer 101 to conduct electric current to the n-type layer. The surface of the opto-mechanical support structure 320 may have microchannels 322. Using $t_0$ to represent the depth of the microchannels 322, with the corresponding physical stress taken into account, to and $t_M$ may be configured to meet the following relationship: $t_0 \leq t_M/2$ according to some implementations. In the illustrative example, $t_0 = t_M/2$.

Figure 4:
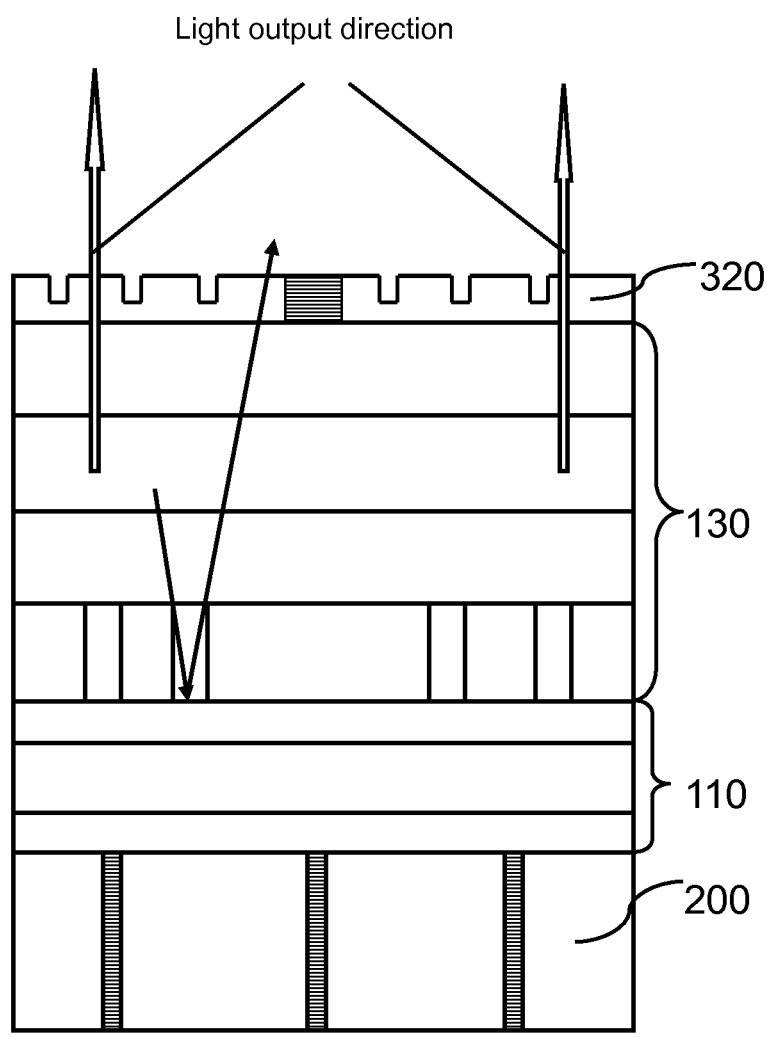
FIG. 4 is a schematic view of a light-emitting direction of the semiconductor device according to some implementations.
Figure 5:
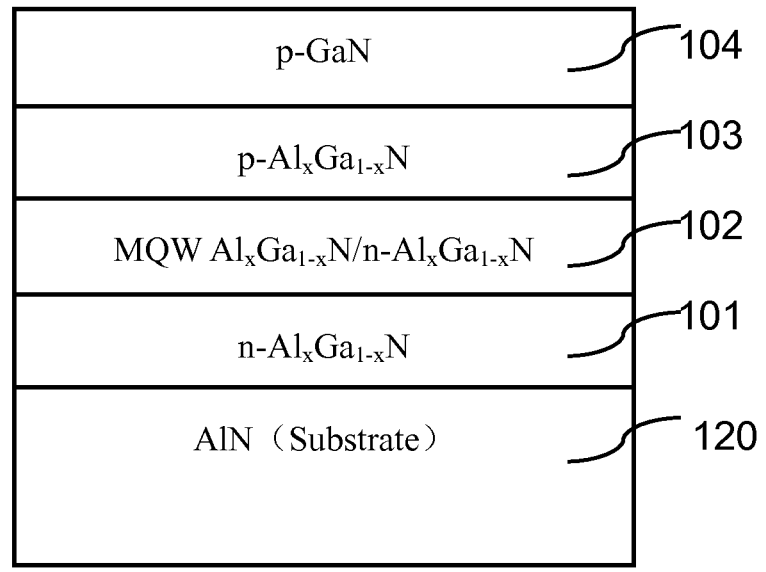
FIGS. 5 through 9 are cross-sectional diagrams depicting the semiconductor device manufacturing process according to some implementations.
Figure 6:
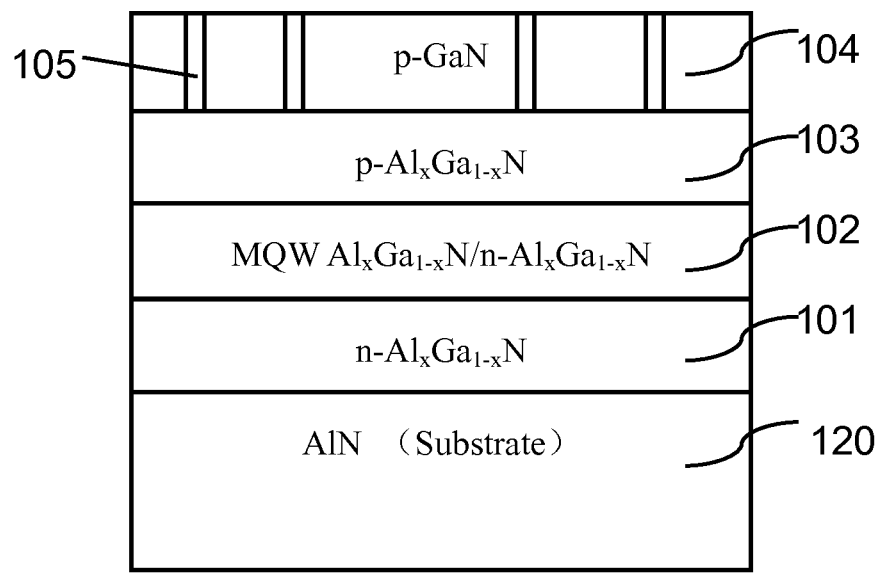
Figure 7:
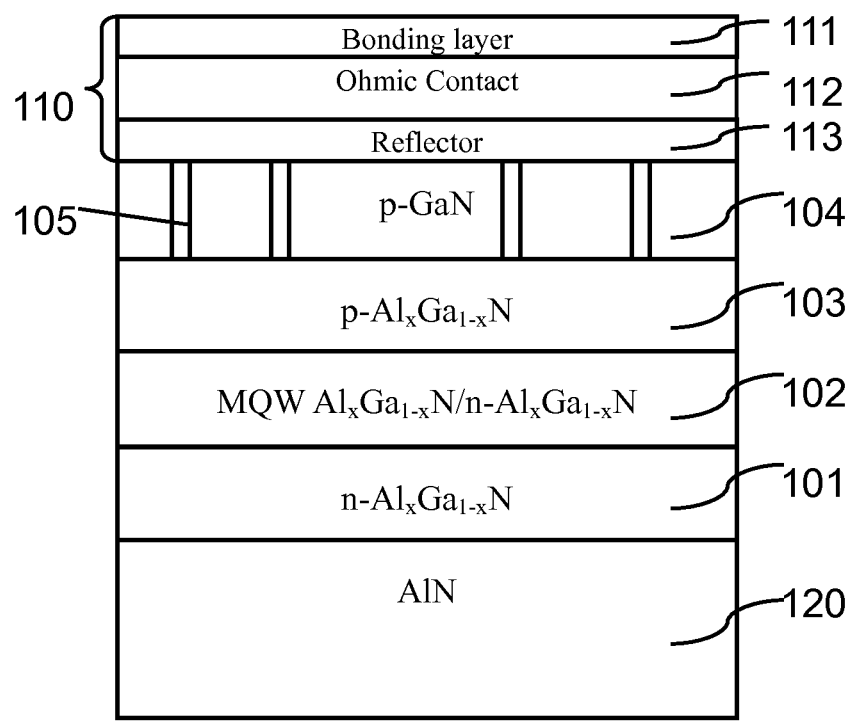

As shown in FIG. 4, the light-emitting device, through the conductive channels 202 of the submount and the conductive channels 321 of the opto-mechanical support structure 320, may be coupled to the external current, and the light-emitting layer 102 can emit light though the current injection. The direct light may directly go through the n-type layer 101, and directly emit via light extraction through the opto-mechanical support structure. The reflected light may go through the microchannels 105 of the p-type semiconductor layer 104 and, via reflection on the metal reflective layer 111, travel in the direction of light emission, thereby further reducing the UV self-absorption by the p-type semiconductor overlying layer 104 thus increasing light emission efficiency.

In some other implementations, a fabrication method is provided concerning the transfer the light emitting body structure to a submount with conductive paths and of high thermal conductivity. A method to prepare p-layer microchannels for light transmission, and a method to prepare the opto-mechanical support structure are also provided.

The p-layer microchannels for light transmission can be formed using dry etching or wet chemical etching. In these technologies, a photoresist can be used as protection. A photolithography method can be used to form the desired pattern, and then the structures can be formed by etching. After removing the photoresist and the protective layer, a metallic reflective film layer can be formed on the p surface, using a highly reflective metal material such as Al, Pt, Ag, etc. An ohmic contact metal structure can then be prepared. The total coverage area, of the microchannels, under a condition that it does not affecting the conductivity of the p layer, does not exceed 80% of the total area according to some implementations. The p-layer microchannels can greatly enhance the light emission efficiency of the light emitting device.

A submount with array of holes to be filled with conductive materials can be formed using a variety of methods. The holes can be drilled using laser or mechanical drilling, and then these holes can be filled with one or more conductive materials, such as gold, copper, nickel, etc. After making an eutectic bonding layer on the surface of the submount, the submount may be bonded with the metal layer of the p-layer. The eutectic metal can be an eutectic alloy such as AuSn, AgSn, with a property of allowing the submount to bond with the p-layer metal by reaching a melting state at a relatively low temperature to form a substantially void-free bonding.

The opto-mechanical support structure may be formed from the single-crystal substrate. Through a chemical or a mechanical method, or a combination of both, the single-crystal substrate may be thinned while the thickness may be controlled based on the epitaxial layer physical (tensile/compressive) stress tolerance range. Once the single-crystal substrate thinning is completed, the relevant channel patterns may be prepared using a dry-etching or a wet-etching method. The conductive channels and microchannels for light transmission areas can be created using a laser processing method and twice-etching method, a wet method, or dry and wet combination etching method. For example, after thinning the single-crystal substrate using mechanical grinding and polishing, a layer of $SiO_2$ can be used as a protective film, and one layer of photoresist may be spin-coated. The corresponding patterns may be formed using a light-exposure method. After coating the n layers with the corresponding metal, the photoresist may be removed. A second lithography may be employed to form the patterns of the microchannels. A dry, wet, or a combination of the dry and wet methods may be employed to form the micro-channels. According to some implementations, the depth of the patterns does not exceed half of the depth of the conductive through-holes. Opto-mechanical support structures with controllable thickness and optical patterns can enhance the light emitting efficiency of the light-emitting device.

FIGS. 5 through 9 provide detailed descriptions of the example fabrication methods as follows.

First, epitaxially and sequentially on the AlN substrate 120, n-type semiconductor contact layer 101, light-emitting layer 102, p-layer semi-conductor contact layer 103, and p-type semiconductor cover layer 104 may be grown.

Next, on p-type semiconductor overlying layer 104, a dry-etching method may be used to create microchannels 105, the depth of the micron channels being between 10~500 nm. On the surface of the p-type semiconductor overlying layer 104, create a reflective metal layer 111. The metal reflective layer material may be, for example, Al, with a thickness between 5-1000 nm. It can include the following metals: Al, Ag, Ni, Au, Cu, Pd, or Rh. Through annealing in a high-temperature environment under a $N_2$ atmosphere, its ohmic contact characteristics may be achieved, and its adhesion to the p-type semiconductor overlying layer 104 may be enhanced. Ohmic metal contact layer 112 and bonding layer 113 may be prepared over the aforementioned reflective metal layer 111. The ohmic metal contact layer material may be a Ti/Pt/Au metal stack, with a thickness of 0.5~10 μm, and can also be any metal stack that comprises, for example, one or more of Cr, Ni, Co, Cu, Sn, or Au. The bonding layer 113 material may be an eutectic AuSn alloy, with a thickness of 1~10 μm, and can also be any metal stack that comprises, for example, one or more of Ag, Ni, Sn, Cu, Au, etc.

Next, over the contact layer 112 and the bonding layer 113, the light emitting structure and the submount with periodic conductive pathways may be bonded at an elevated temperature and pressure. Process conditions may include, for example: temperature 0~500° C., pressure 0~800 kg, and time 0~180 minutes.

Next, chemical mechanical polishing method is used to thin the AlN single-crystal substrate 120 with an epitaxial structure, reducing its thickness to about ¼ integer multiple of the emission wavelength, and controlling the final thickness to be about 5~100 μm. Over the thinned substrate 320, dry etching method is used to form a series of microchannel patterns 322, forming the opto-mechanical support structure 320, so as to extract more light emitted from the light-emitting body. According to some implementations, the depth of blind channels cannot exceed ½ the thickness of the single-crystal substrate.

Next, at locations corresponding to the pitch of the opto-mechanical support structure 320, using laser or a wet-etching method to prepare holes that extend to the n-type semiconductor layer, Filling the holes with a conductive material to form conductive channels 321. Preparing a contacting metal layer over the channels for connection to external power source. Preferred choices of materials include Ti, Al, or Au, or any metal stack that comprises Ti, Al, Au, Ag, Rh, and Cr. Through annealing under a high temperature in a $N_2$ atmosphere, the ohmic contact characteristics can be achieved and its adhesion to the n-type semiconductor layer may be enhanced. N-electrode pads may be formed over the n-type ohmic contact metal layer. The material can be, for example, TiAu, with a thickness of 1~20 μm, Next, based on the pitch of the conductive path on the submount 200, the individual devices in the crystal can be singulated to form individual chips.

According to some implementations, either the n-type semiconductor layer or the p-type semiconductor layer can be the light-emitting side. In the following example, the n-type semiconductor layer is taken as the light-emitting side. Taking the p-type layer as the light-emitting side may follow the similar basic principles of device fabrication.

Figure 10:
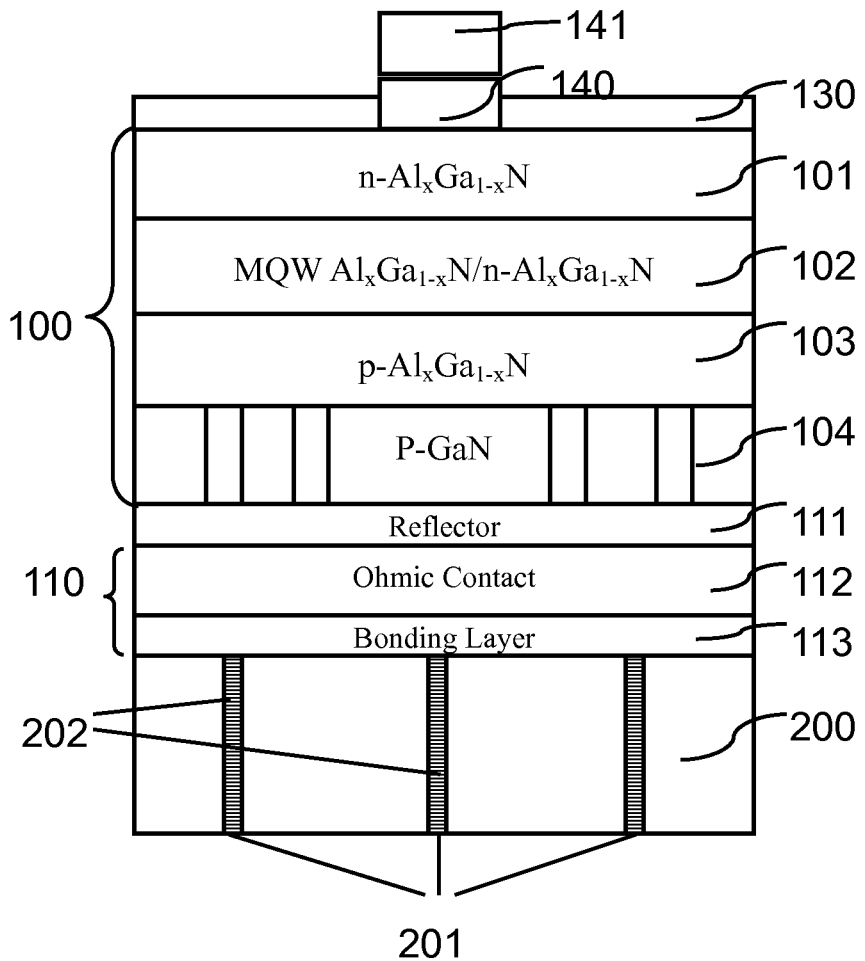
FIG. 10 is a schematic view of a light emitting device structure including a submount with vias and the top n-contact.

Shown in FIG. 10 is a deep-UV semiconductor light-emitting device, comprising: heat-dissipating submount 200, metal structure 110, light-emitting epitaxial structure 111, and light-emitting epitaxial structure 100. The submount 200 is similar to that of the embodiment illustrated in FIG. 2.

The metal structure 110 comprises ohmic metal contact layer 112 and bonding layer 113. Bonding layer 113 may comprise a conductive material with a resistivity between about $1.0 \times 10^{-8}$ and about $1.0 \times 10^{-4}$ Ω·m, and a melting point of above 200° C. Contact layer 112 may comprise a conductive material with a resistivity between about $1.0 \times 10^{-8}$ and about $1.0 \times 10^{-4}$ Ω·m. This material can be selected from Au, Ag, Cu, Al, and Pt.

The metal reflective layer 111 may be disposed between the metal structure 110 and the light-emitting epitaxial structure 100, and may be coupled to the ohmic metal contact layer 112. The metal reflective layer may comprise Al, with a thickness between 5-1000 nm. It can also be an alloy containing Al, Ag, Ni, Au, Cu, Pd and Rh.

The light-emitting epitaxial structure 100 is similar to that of the embodiment illustrated in FIG. 2. To better enhance the light extraction efficiency, the surface of the light-emitting side of the n-type semiconductor contact layer 101 can be subjected to a chemically etch light-enhancing process.

Figure 11:
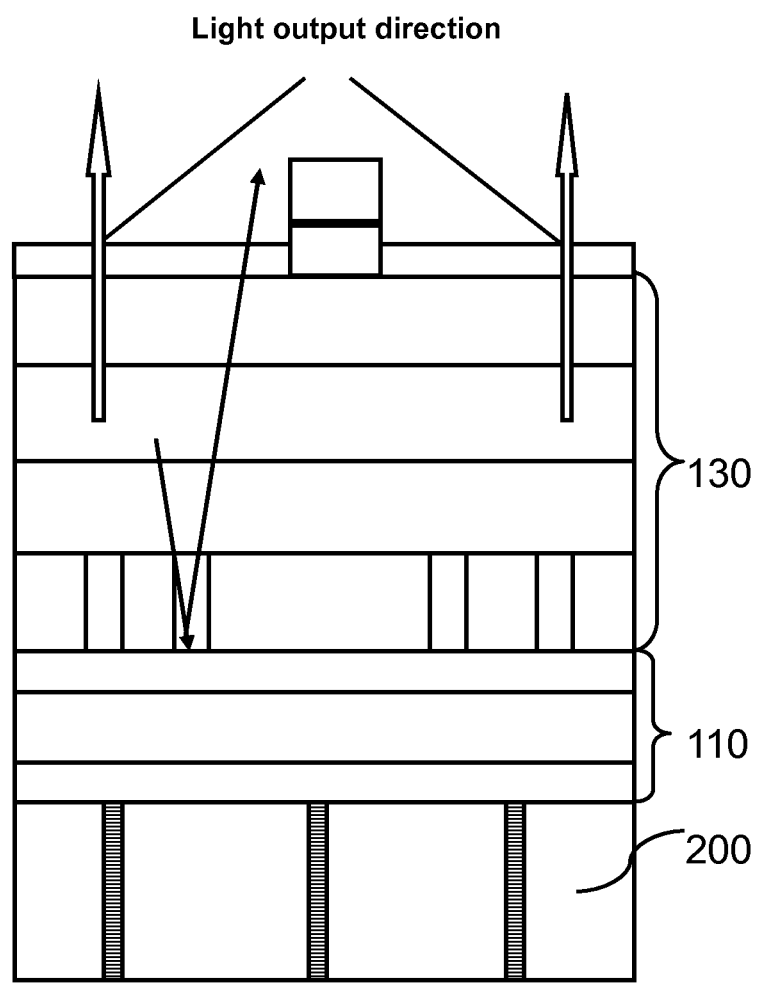
FIG. 11 is a cross-sectional view of a light emitting structure showing the direction of emitted light.

As illustrated in FIG. 11, the light-emitting device, through the conductive channels 202 of the submount 200, may be connected to the external current, and the light-emitting layer 102 emits light under the current injection. Direct light can directly go through the n-type layer 101 and directly output via light extraction through the light-enhancing structure on the surface. The reflected light may go through the microchannels 105 of the p-type semiconductor layer 104 and, via reflection on the metal reflective layer 111, transmit in the direction of light emission, thus further reducing the UV self-absorption by the p-type semiconductor overlying layer 104 and increasing light emission efficiency of the light emitting structure.

A manufacture process of the UVC semiconductor light-emitting device is provided, including: a method to remove the substrate, a method to transfer the light-emitting body structure to a submount with conductive channels and with a substrate of high thermal conductivity, and a method to prepare p-layer microchannels for light transmission.

P-layer microchannels can be formed using the methods described above with respect to FIGS. 3 and 4.

The initial fabrication steps may be similar to those of the embodiments described above with respect to FIGS. 4-9, and are not repeated here.

Figure 8:
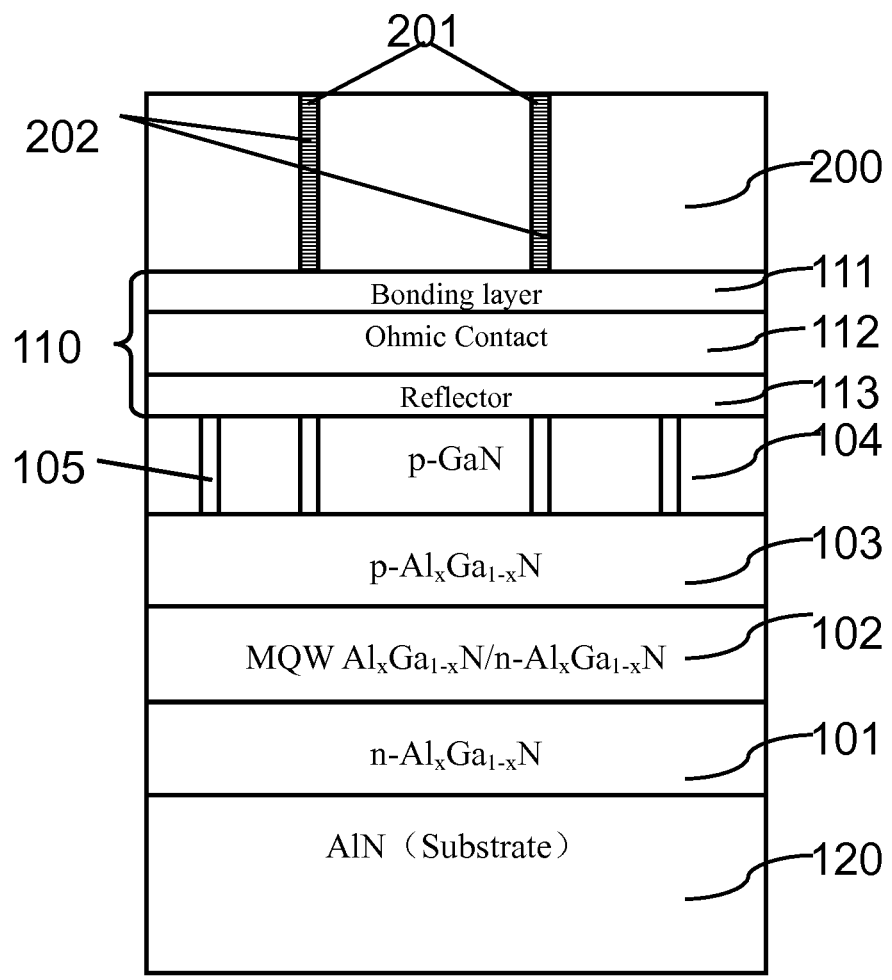
Figure 9:
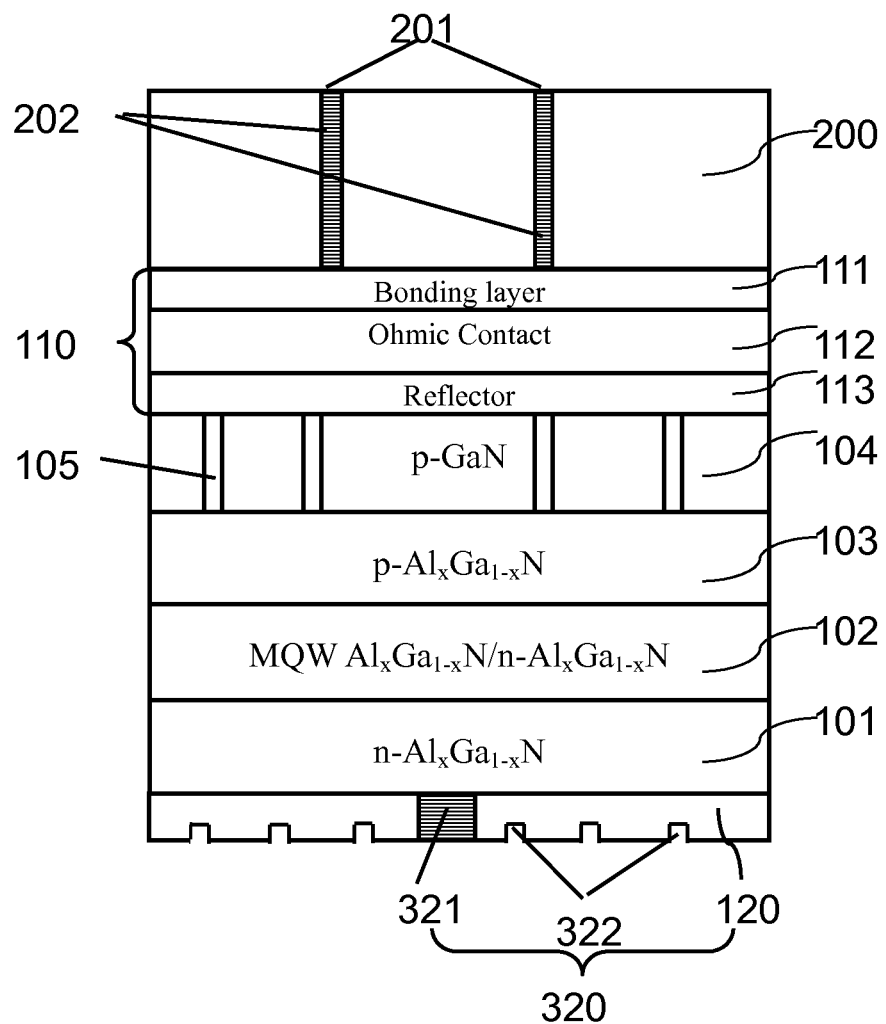
Figure 12:
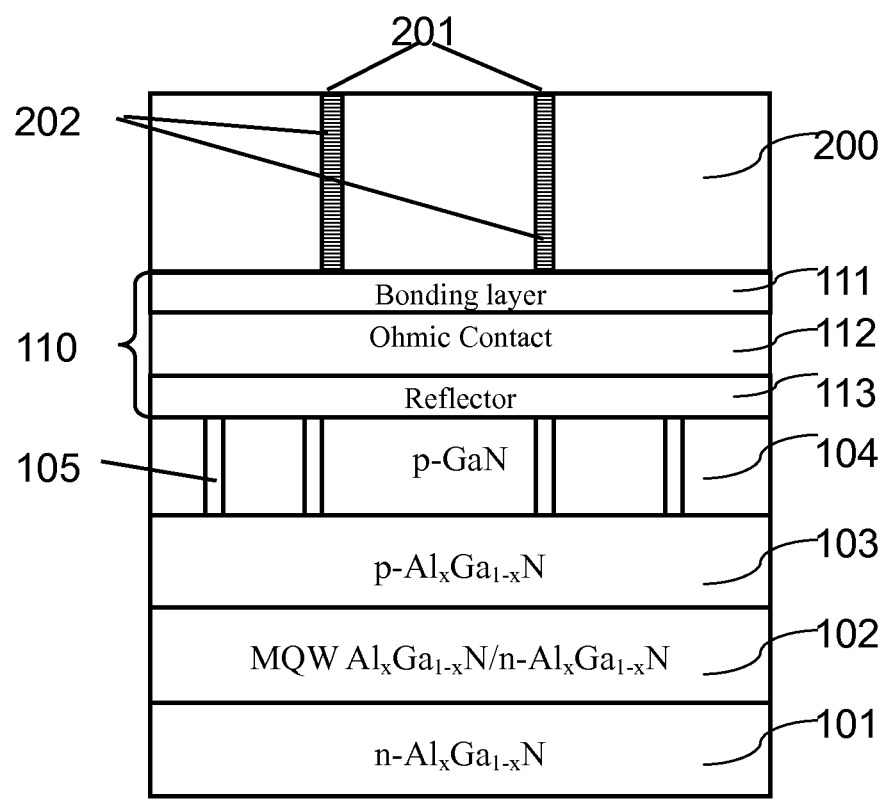
FIG. 12 illustrates a manufacturing method of completely removing the substrate exposing the n-layer for direct contact fabrication according to some implementations.

The AlN single-crystal substrate 120 used for growing an epitaxial structure (as illustrated in FIG. 8) may be removed using chemical polishing, exposing the n-type semiconductor contact layer 101 through chemical polishing thickness control, as illustrated in FIG. 12. Referring back to FIG. 10, an n-type ohmic contact metal layer 140 may be formed over the surface of the n-type semiconductor contact layer 101, the material preferably selected from metal Ti, Al, or Au, or any metal including Ti, Al, Au, Ag, Rh, and Cr. A UV transmission-enhancing layer 130 may be disposed over the exposed n-type semiconductor layer 101. An n-electrode pad 141 may be formed over the n-type ohmic contact metal layer 140, its material being preferably TiAu with a thickness of 1~20 μm.

Next, based on the pitch of the conductive paths on the submount 200, the individual components elements in the crystal can be singulated to form individual chips.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting device comprising:
    a substrate;
    an n layer;
    an active light emitting region,
    a p layer;
    a support portion configured to provide both mechanical support and improve light transmission disposed over a light emitting side of the device;
    a submount over a side of the active light emitting region opposite a side of the substrate, wherein the submount includes a plurality of conductive vias;
    a contact layer;
    a conductive layer; and
    a reflective contact layer opposite to the light emitting side;
    wherein the support portion is formed by thinning the substrate.

2. The light emitting device of claim 1, wherein an area of the plurality of conductive vias has a fraction of less than 60% of a total surface area of the submount.

3. The light emitting device of claim 2, further comprising a bonding layer over a surface of the submount.

4. The light emitting device of claim 3, wherein the bonding layer includes a portion having an electrical resistivity in a range of $1.0 \times 10^{-8}$ to $1.0 \times 10^{-4}$ $\Omega \cdot m$.

5. The light emitting device of claim 4, wherein the bonding layer has a melting point above 200° C.

6. The light emitting device of claim 1, wherein the conductive layer includes a portion having an electrical resistivity in a range of $1.0 \times 10^{-8}$ to $1.0 \times 10^{-4}$ $\Omega \cdot m$.

7. The light emitting device of claim 1, further comprising a reflector metal contact comprising one or more layers of Al, Ag, Pt, or Au.

8. The light emitting device of claim 1, further comprising a contacting metal layer comprising a combination of one or more layers of Cr, Ti, Pt, Au, Al, Ni, Pd, and Ge.

9. The light emitting device of claim 1, wherein the support portion includes a plurality of conductive channels configured to electrically couple the device to an external power source.

10. The light emitting device of claim 1, wherein an area of the plurality of conductive vias is a fraction of less than 40% of a total surface area of the submount so as to maintain a substantial mechanical strength of the device.

11. The light emitting device of claim 9, wherein the support portion has a thickness of not less than 15 microns.

12. The light emitting device of claim 9, wherein the support portion has an array of blind vias forming an optical functional surface to improve light output.

13. The light emitting device of claim 12, wherein the blind vias have a depth less than half a thickness of the support portion so as to maintain a substantial mechanical strength of the support portion.

14. The light emitting device of claim 12, wherein the blind vias have a surface area less than 60% of a total surface area of the support portion.

15. The light emitting device of claim 1, further comprising:
    a reflector opposite the light emitting side; and
    a plurality of microchannels configured to optically couple the active light emitting region and the reflector.

16. A method of manufacturing a light emitting device, wherein the device comprises:
    a substrate;
    an n layer;
    an active light emitting region,
    a p layer;
    a support portion configured to provide both mechanical support and improve light transmission disposed over a light emitting side of the device;
    a submount over a side of the active light emitting region opposite a side of the substrate, wherein the submount includes a plurality of conductive vias; a contact layer;
    a conductive layer; and
    a reflective contact layer opposite to the light emitting side;
    wherein the method comprises:
        providing the substrate, the n layer, the active light emitting region, the p layer; the support portion configured to provide both mechanical support and improve light transmission disposed over the light emitting side of the device, the submount over the side of the active light emitting region opposite the side of the substrate, wherein the submount includes the plurality of conductive vias, the contact layer, the conductive layer, and the reflective contact layer opposite to the light emitting side; and
        thinning the substrate to form the support portion.

17. The method of claim 16, wherein the device further comprises a reflector, the method further comprising:
    forming a plurality of microchannels in one or more UV-absorbing layers to improve optical coupling between the one or more UV-absorbing layers to the reflector, wherein the one or more UV-absorbing layers include at least one of the n layer or the p layer.

18. The method of claim 16, further comprising:
bonding the substrate, the n layer, the active light emitting region, and the p layer with the submount; and
forming a plurality of blind and through vias in the thinned substrate.

* * * * *